United States Patent
Salter et al.

(10) Patent No.: US 9,573,517 B2
(45) Date of Patent: Feb. 21, 2017

(54) DOOR ILLUMINATION AND WARNING SYSTEM

(71) Applicant: Ford Global Technologies, LLC, Dearborn, MI (US)

(72) Inventors: Stuart C. Salter, White Lake, MI (US); Cornel Lewis Gardner, Romulus, MI (US); Paul Kenneth Dellock, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 14/603,636

(22) Filed: Jan. 23, 2015

(65) Prior Publication Data
US 2015/0138818 A1 May 21, 2015

Related U.S. Application Data

(63) Continuation-in-part of application No. 14/086,442, filed on Nov. 21, 2013.

(51) Int. Cl.
| | |
|---|---|
| *B60Q 3/02* | (2006.01) |
| *B60Q 3/06* | (2006.01) |
| *H05B 37/02* | (2006.01) |
| *B60Q 3/00* | (2006.01) |
| *B60Q 1/26* | (2006.01) |
| *B60Q 1/32* | (2006.01) |
| *H05K 3/46* | (2006.01) |

(52) U.S. Cl.
CPC ............ *B60Q 3/0216* (2013.01); *B60Q 3/008* (2013.01); *B60Q 3/0293* (2013.01); *B60Q 3/06* (2013.01); *H05B 37/0218* (2013.01); *H05B 37/0227* (2013.01); *B60Q 1/26* (2013.01); *B60Q 1/323* (2013.01); *H05K 3/4664* (2013.01); *H05K 2201/0108* (2013.01); *H05K 2201/10106* (2013.01); *Y02B 20/46* (2013.01)

(58) Field of Classification Search
CPC .......... B60Q 3/0216; B60Q 3/06; B60Q 1/323
See application file for complete search history.

(56) References Cited

U.S. PATENT DOCUMENTS

| | | |
|---|---|---|
| 5,121,098 A | 6/1992 | Chen |
| 5,709,453 A | 1/1998 | Krent et al. |
| 5,851,840 A | 12/1998 | Sluka et al. |
| 5,969,603 A | 10/1999 | Wang |
| 6,031,511 A | 2/2000 | DeLuca et al. |
| 6,117,362 A | 9/2000 | Yen et al. |

(Continued)

FOREIGN PATENT DOCUMENTS

| | | |
|---|---|---|
| CA | 1279626 C | 1/1991 |
| CN | 201169230 Y | 12/2008 |

(Continued)

*Primary Examiner* — Robert May
(74) *Attorney, Agent, or Firm* — Vichit Chea; Price Heneveld LLP

(57) ABSTRACT

An illumination apparatus for a vehicle is disclosed. The apparatus comprises a closure frame configured to engage an opening formed by a body of the vehicle. A light source is disposed proximate an edge of the closure frame such that an emission of light from the light source is projected through a gap between the closure frame and the body. The emission is projected through the gap in response to the closure frame being arranged in an ajar position.

19 Claims, 8 Drawing Sheets

(56) References Cited

U.S. PATENT DOCUMENTS

| | | |
|---|---|---|
| 6,184,786 B1 | 2/2001 | Medeiros |
| 6,264,353 B1 | 7/2001 | Caraher et al. |
| 6,494,490 B1 | 12/2002 | Trantoul |
| 6,577,073 B2 | 6/2003 | Shimizu et al. |
| 6,729,738 B2 | 5/2004 | Fuwausa et al. |
| 6,737,964 B2 | 5/2004 | Samman et al. |
| 6,773,129 B2 | 8/2004 | Anderson, Jr. et al. |
| 6,820,888 B1 | 11/2004 | Griffin |
| 6,859,148 B2 | 2/2005 | Miller |
| 6,871,986 B2 | 3/2005 | Yamanaka et al. |
| 6,953,536 B2 | 10/2005 | Yen et al. |
| 6,990,922 B2 | 1/2006 | Ichikawa et al. |
| 7,068,160 B2 | 6/2006 | Tourneur et al. |
| 7,161,472 B2 | 1/2007 | Strumolo et al. |
| 7,213,923 B2 | 5/2007 | Liu et al. |
| 7,264,366 B2 | 9/2007 | Hulse |
| 7,264,367 B2 | 9/2007 | Hulse |
| 7,441,914 B2 | 10/2008 | Palmer et al. |
| 7,501,749 B2 | 3/2009 | Takeda et al. |
| 7,575,349 B2 | 8/2009 | Bucher et al. |
| 7,745,818 B2 | 6/2010 | Sofue et al. |
| 7,753,541 B2 | 7/2010 | Chen et al. |
| 7,834,548 B2 | 11/2010 | Jousse et al. |
| 7,862,220 B2 | 1/2011 | Cannon et al. |
| 7,987,030 B2 * | 7/2011 | Flores ................ B60Q 3/0233 340/435 |
| 8,016,465 B2 | 9/2011 | Egerer et al. |
| 8,022,818 B2 | 9/2011 | la Tendresse et al. |
| 8,097,843 B2 | 1/2012 | Agrawal et al. |
| 8,136,425 B2 | 3/2012 | Bostick |
| 8,163,201 B2 | 4/2012 | Agrawal et al. |
| 8,178,852 B2 | 5/2012 | Kingsley et al. |
| 8,197,105 B2 | 6/2012 | Yang |
| 8,203,260 B2 | 6/2012 | Li et al. |
| 8,207,511 B2 | 6/2012 | Bortz et al. |
| 8,232,533 B2 | 7/2012 | Kingsley et al. |
| 8,247,761 B1 | 8/2012 | Agrawal et al. |
| 8,286,378 B2 | 10/2012 | Martin et al. |
| 8,408,766 B2 | 4/2013 | Wilson et al. |
| 8,415,642 B2 | 4/2013 | Kingsley et al. |
| 8,421,811 B2 | 4/2013 | Odland et al. |
| 8,466,438 B2 | 6/2013 | Lambert et al. |
| 8,519,359 B2 | 8/2013 | Kingsley et al. |
| 8,519,362 B2 | 8/2013 | Labrot et al. |
| 8,552,848 B2 | 10/2013 | Rao et al. |
| 8,606,430 B2 | 12/2013 | Seder et al. |
| 8,624,716 B2 | 1/2014 | Englander |
| 8,631,598 B2 | 1/2014 | Li et al. |
| 8,664,624 B2 | 3/2014 | Kingsley et al. |
| 8,683,722 B1 | 4/2014 | Cowan |
| 8,686,842 B2 | 4/2014 | Schuessler et al. |
| 8,724,054 B2 | 5/2014 | Jones |
| 8,754,426 B2 | 6/2014 | Marx et al. |
| 8,773,012 B2 | 7/2014 | Ryu et al. |
| 8,846,184 B2 | 9/2014 | Agrawal et al. |
| 8,876,352 B2 | 11/2014 | Robbins et al. |
| 8,952,341 B2 | 2/2015 | Kingsley et al. |
| 9,006,751 B2 | 4/2015 | Kleo et al. |
| 9,057,021 B2 | 6/2015 | Kingsley et al. |
| 9,065,447 B2 | 6/2015 | Buttolo et al. |
| 9,187,034 B2 | 11/2015 | Tarahomi et al. |
| 9,299,887 B2 | 3/2016 | Lowenthal et al. |
| 2002/0149207 A1 | 10/2002 | Bromhall |
| 2002/0159741 A1 | 10/2002 | Graves et al. |
| 2002/0163792 A1 | 11/2002 | Formoso |
| 2003/0179548 A1 | 9/2003 | Becker et al. |
| 2004/0213088 A1 | 10/2004 | Fuwausa |
| 2006/0087826 A1 | 4/2006 | Anderson, Jr. |
| 2006/0097121 A1 | 5/2006 | Fugate |
| 2007/0032319 A1 | 2/2007 | Tufte |
| 2007/0285938 A1 | 12/2007 | Palmer et al. |
| 2009/0219730 A1 | 9/2009 | Syfert et al. |
| 2009/0251920 A1 | 10/2009 | Kino et al. |
| 2009/0260562 A1 | 10/2009 | Folstad et al. |
| 2009/0262515 A1 | 10/2009 | Lee et al. |
| 2010/0321945 A1 * | 12/2010 | Lang ................ B60Q 1/2669 362/501 |
| 2011/0012062 A1 | 1/2011 | Agrawal et al. |
| 2011/0115376 A1 * | 5/2011 | Shiratsuchi .......... B60Q 3/0216 315/77 |
| 2012/0001406 A1 | 1/2012 | Paxton et al. |
| 2012/0104954 A1 | 5/2012 | Huang |
| 2012/0183677 A1 | 7/2012 | Agrawal et al. |
| 2012/0280528 A1 | 11/2012 | Dellock et al. |
| 2013/0335994 A1 | 12/2013 | Mulder et al. |
| 2014/0065442 A1 | 3/2014 | Kingsley et al. |
| 2014/0103258 A1 | 4/2014 | Agrawal et al. |
| 2014/0264396 A1 | 9/2014 | Lowenthal et al. |
| 2014/0266666 A1 | 9/2014 | Habibi |
| 2014/0373898 A1 | 12/2014 | Rogers et al. |
| 2015/0046027 A1 * | 2/2015 | Sura ................. B60K 35/00 701/36 |
| 2015/0138789 A1 | 5/2015 | Singer et al. |
| 2015/0267881 A1 | 9/2015 | Salter et al. |
| 2016/0016506 A1 * | 1/2016 | Collins .............. B60J 10/02 362/464 |

FOREIGN PATENT DOCUMENTS

| | | |
|---|---|---|
| CN | 101337492 A | 1/2009 |
| CN | 201193011 Y | 2/2009 |
| DE | 29708699 U1 | 7/1997 |
| DE | 10319396 A1 | 11/2004 |
| EP | 1793261 A1 | 6/2007 |
| EP | 2778209 A1 | 9/2014 |
| JP | 2000159011 A | 6/2000 |
| JP | 2001246982 A | 9/2001 |
| JP | 2007238063 A | 9/2007 |
| JP | 2007308128 A | 11/2007 |
| WO | 2006047306 A1 | 5/2006 |
| WO | 2014068440 A1 | 5/2014 |

* cited by examiner

DOOR ILLUMINATION AND WARNING SYSTEM

CROSS-REFERENCE TO RELATED APPLICATION

This application is a continuation-in-part of U.S. patent application Ser. No. 14/086,442, filed Nov. 21, 2013, and entitled "VEHICLE LIGHTING SYSTEM WITH PHOTOLUMINESCENT STRUCTURE." The aforementioned related application is hereby incorporated by reference in its entirety.

FIELD OF THE INVENTION

The present disclosure generally relates to vehicle lighting systems, and more particularly, to vehicle lighting systems having thin profiles that may be operable to conform to non-planar surfaces.

BACKGROUND OF THE INVENTION

Lighting in vehicles traditionally has been applied to provide illumination for reading, vehicle entry, and operation. However, lighting may also be applied to improve vehicle features and systems to ensure that vehicle passengers, operators, and onlookers have an improved experience. Such improvements may arise from improvements in safety, visibility, aesthetics, and/or features. The disclosure provides for a lighting system operable to illuminate a portion of a vehicle and in some embodiments, may alert an operator of the vehicle of a vehicle condition, such as a door ajar condition.

SUMMARY OF THE INVENTION

According to one aspect of the present disclosure, an illumination apparatus for a vehicle is disclosed. The apparatus comprises a closure frame configured to engage an opening formed by a body of the vehicle. A light source is disposed proximate an edge of the closure frame such that an emission of light from the light source is projected through a gap between the closure frame and the body. The emission is projected through the gap in response to the closure frame being arranged in an ajar position.

According to another aspect of the present disclosure, an illumination apparatus for a vehicle is disclosed. The apparatus comprises a door configured to engage an opening formed by a body of the vehicle. A light source is disposed proximate an edge of the door such that an emission of light from the light source is projected through a gap between the door and at least one panel of the vehicle. The emission is projected through the gap in response to the door being arranged in an ajar position.

According to yet another aspect of the present disclosure, an illumination apparatus for a vehicle is disclosed. The apparatus comprises a door configured to engage an opening formed by a body of the vehicle. A light source is disposed proximate an edge of the door. The light source is configured such that an emission of light from the light source is projected through a gap between the door and at least one panel of the vehicle.

These and other aspects, objects, and features of the present disclosure will be understood and appreciated by those skilled in the art upon studying the following specification, claims, and appended drawings.

DETAILED DESCRIPTION OF THE PREFERRED EMBODIMENTS

As required, detailed embodiments of the present disclosure are disclosed herein. However, it is to be understood that the disclosed embodiments are merely exemplary of the disclosure that may be embodied in various and alternative forms. The figures are not necessarily to a detailed design and some schematics may be exaggerated or minimized to show function overview. Therefore, specific structural and functional details disclosed herein are not to be interpreted as limiting, but merely as a representative basis for teaching one skilled in the art to variously employ the present disclosure.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

The following disclosure describes an illumination apparatus in which a vehicle fixture is configured to receive a light producing assembly. The light producing assembly may correspond to a thin, flexible lighting assembly, which may be utilized in a variety of applications. For purposes of this disclosure, a vehicle fixture may refer to any interior or exterior piece of vehicle equipment, or part thereof, suitable for receiving the photoluminescent structure described herein. While the implementation of the illumination apparatus described herein is primarily directed towards automotive vehicle use, it should be appreciated that the apparatus or system may also be implemented in other types of vehicles designed to transport one or more passengers such as, but not limited to, watercrafts, trains, and aircrafts.

Figure 1:
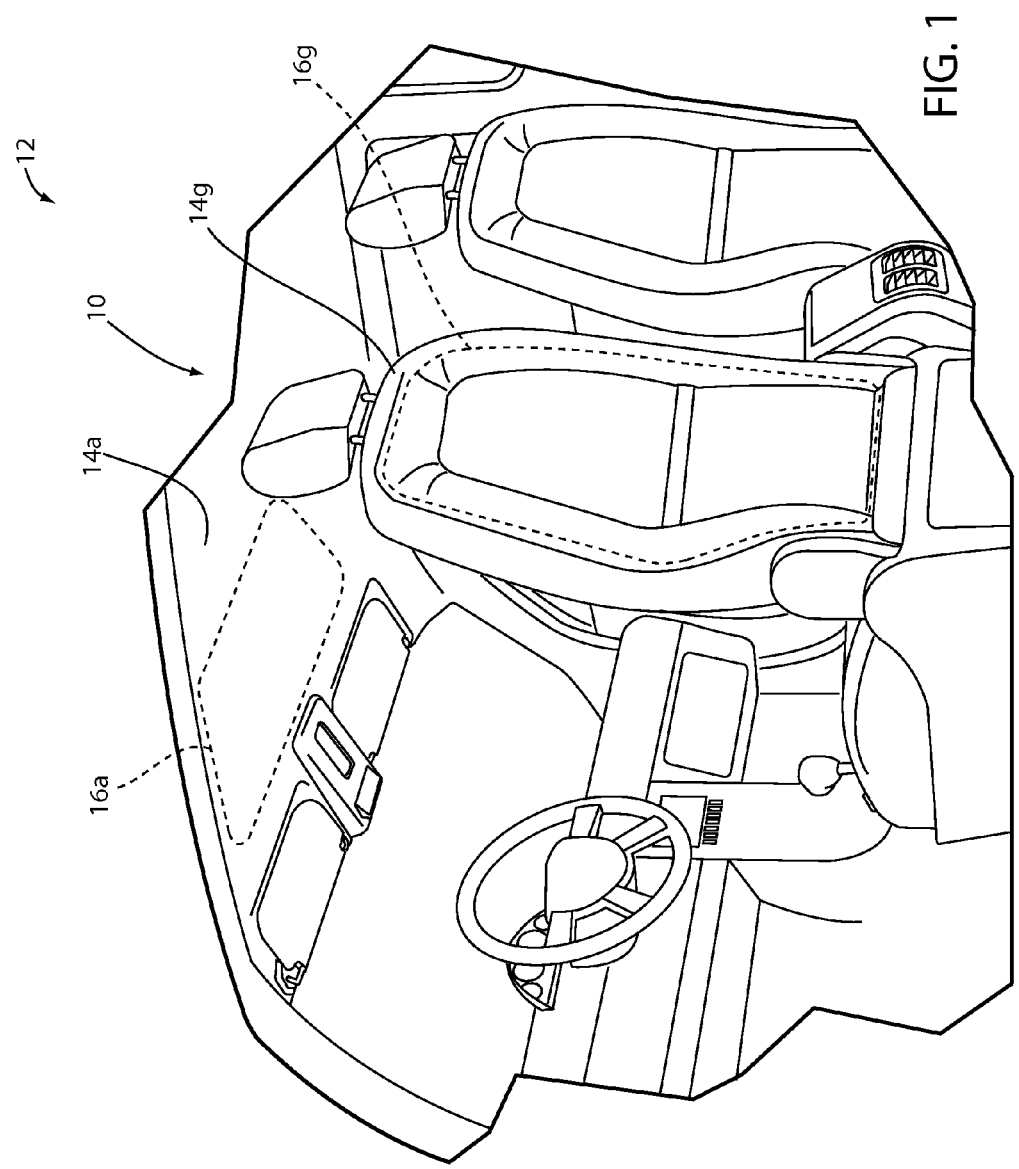
FIG. 1 is a perspective view of a front passenger compartment of an automotive vehicle having various illuminated fixtures.
Figure 2:
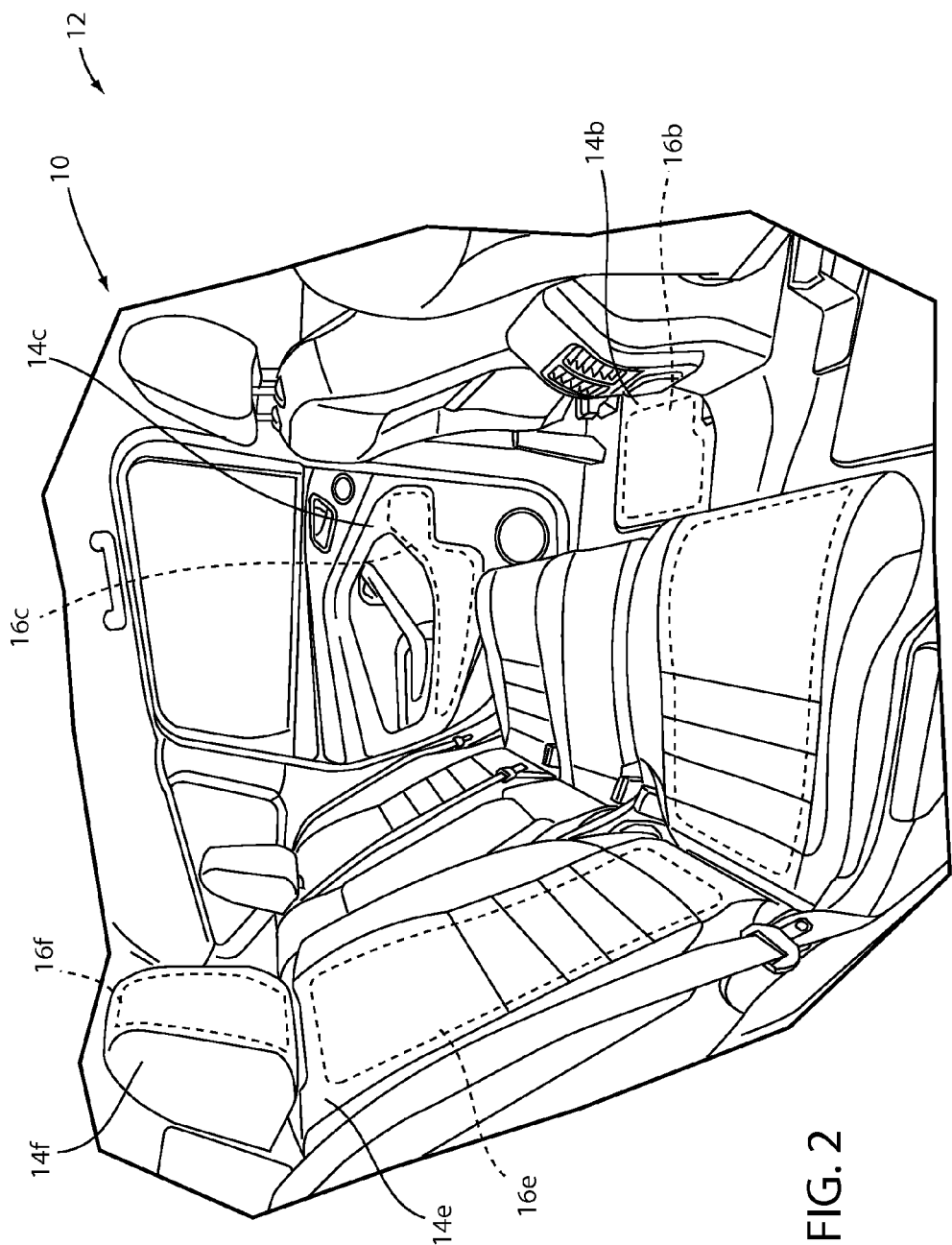
FIG. 2 is a perspective view of a rear passenger compartment of an automotive vehicle having various illuminated fixtures.

Referring to FIGS. 1 and 2, a passenger compartment 10 of an automotive vehicle 12 is generally shown having a variety of exemplary vehicle fixtures 14a-14g located in the front and rear of the passenger compartment 10. The fixtures 14a-14g generally correspond to a headliner 14a, a floor mat 14b, a door trim panel 14c, and various parts of a seat including a seat base 14d, a backrest 14e, a headrest 14f, and a seat back 14g, respectively. For purposes of illustration, and not limitation, each fixture 14a-14g may be configured to receive a light producing assembly, as further discussed herein. A light producing assembly may be disposed on a selected area 16a-16g of each fixture 14a-14g. The vehicle 12 may comprise a plurality of light producing assemblies which may be utilized independently or in combination to provide functional and/or decorative lighting for the vehicle 12.

With respect to the illumination apparatus described herein, it should be appreciated that the selected area 16a-16g is not limited to any particular shape or size and may include portions of a fixture having planar and/or non-planar configurations. For example, in an exemplary embodiment, the light producing assembly may have a thin profile and be of flexible materials providing for the assembly to conform to non-planar surfaces. Although some fixtures 14a-14g have been exemplarily provided, it should be appreciated that other fixtures may be used in accordance with the vehicle lighting system described herein. Such fixtures may include instrument panels and components thereon, interactive mechanisms (e.g. push buttons, switches, dials, and the like), indicating devices (e.g. speedometer, tachometer, etc.), printed surfaces, and various interior and/or exterior portions of the vehicle 12, which may be of metallic, polymeric, or a variety of materials.

Figure 3:
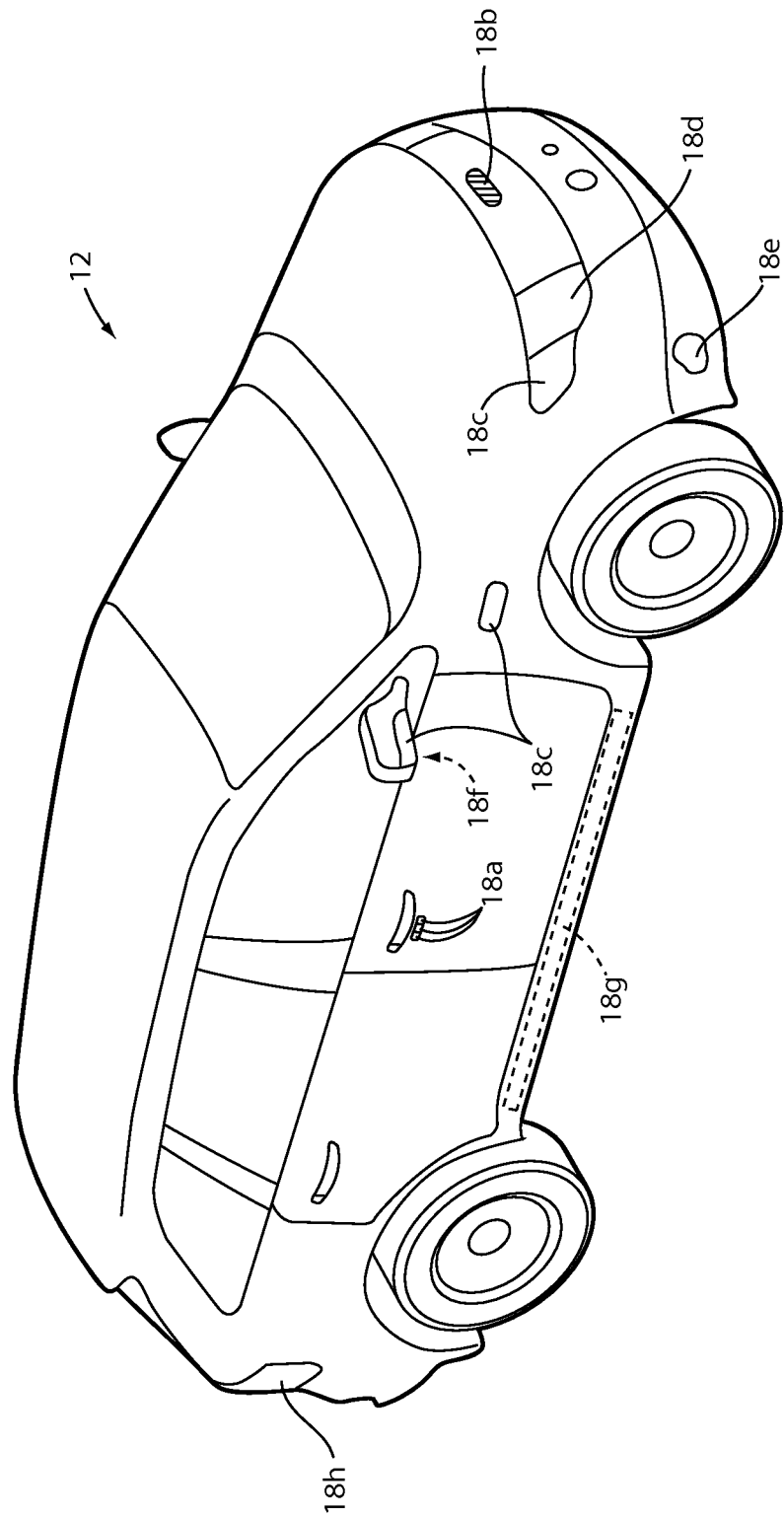
FIG. 3 is a perspective view of an exterior of an automotive vehicle having various illuminated features.

Referring to FIG. 3 a perspective view of an exterior of the vehicle 12 is shown. In addition to interior fixtures, the light producing assemblies as discussed herein may be utilized to accent, supplement, and/or replace various exterior fixtures 18a-18h. Examples of exterior features 18a-18h may include, but are not limited to, keyless entry buttons 18a, badges 18b, turn indicators 18c, side markers, license plate lamps, cargo area lamps, headlights 18d, fog lights 18e, puddle lamps 18f, side rail lamps, trim lamps 18g, tail lights 18h, etc. Each of the exterior features 18a-18h may provide various functions that may facilitate safe operation and/or improved aesthetics of the vehicle and may also decrease associated manufacturing costs. In this way, the disclosure provides for various lighting systems and devices that may be disposed throughout the vehicle 12.

One or more of the light producing assemblies discussed herein may be in communication with a controller. In some implementations, the controller may further be in communication with a vehicle control module. The vehicle control module may provide signals to the controller in response to various user inputs, vehicle operating information, vehicle status information, etc. In response to one or more signals received from the vehicle control module, the illumination apparatus is operable to control one or more of the light producing assemblies to provide various lighting functions for the vehicle 12. Further details regarding the controller and the vehicle control module are discussed in reference to FIG. 8. Though the light producing assemblies discussed herein are described as being in communication with the controller, one or more of the assemblies may be controlled by various forms of switches and/or analog and/or digital circuitry.

Figure 4:
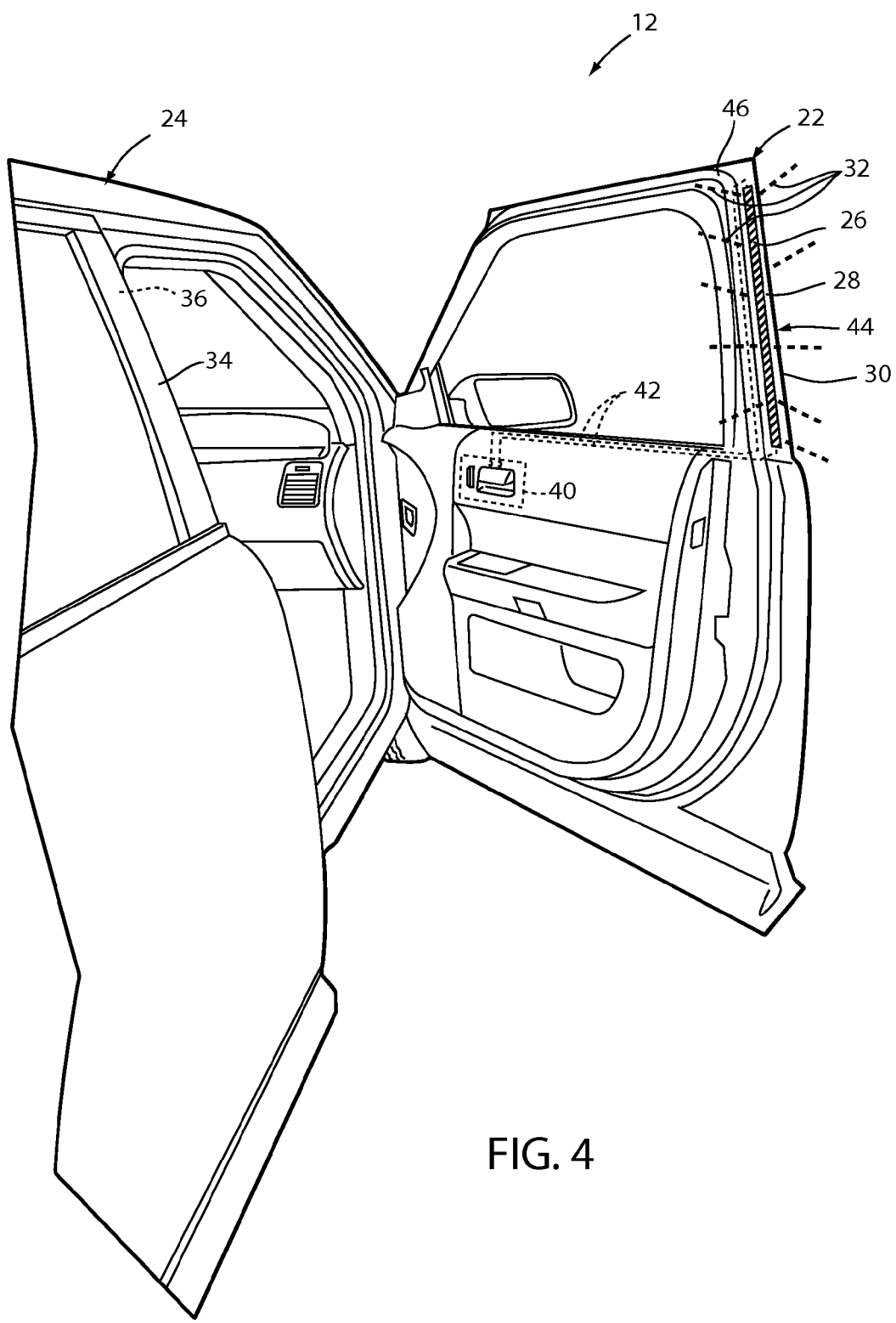
FIG. 4 is a perspective view of a closure of a vehicle arranged in an open orientation comprising a lighting apparatus.

Referring now to FIG. 4, a closure 22 of the vehicle 12 is shown in an open position. As discussed herein, the closure 22 may refer to any barrier or cover configured to secure or enclose various openings of a vehicle. For example, a closure may correspond to an engine compartment hood, a hatch or tailgate opening, a fuel door, and other openings, which may be formed by at least a portion of a body 24 of the vehicle 12. In an exemplary embodiment, the light producing assembly 26 (also referred to as the light assembly 26) may be disposed on an interior surface 28 of a door frame 30. In this configuration, the light assembly 26 is operable to emit an output emission 32 of light that may alert onlookers that the closure 22 is arranged in an open position. The output emission 32 of light is demonstrated by the dashed lines extending from the light assembly 26.

As shown illustrated in FIG. 4, the light assembly 26 is configured to emit the output emission 32 when the closure 22 is arranged in the open position. As further discussed in reference to FIG. 7, the light assembly 26 may further be configured to illuminate a gap formed between the door frame 30 and an adjacent panel 34 of the vehicle 12 when the closure 22 is arranged in an ajar position. Additionally, the light assembly 26 may be configured to be housed between a door jamb 36 and the door frame 30 when the closure 22 is arranged in the closed position. In this way, the disclosure provides for an advantageous lighting apparatus that may be utilized in various vehicles and locations to enhance safe operation as well as the decorative appearance of a vehicle closure.

In an exemplary embodiment, light assembly 26 is in communication with a controller 40 via conductive leads 42, which may be wired through the door frame 30. The leads 42 may be connected to the light assembly 26 via terminals configured to form a circuit in connection with electrodes of the light assembly 26. In this configuration, the controller 40 may be operable to control the light assembly 26 to emit the output emission 32 of light in response to various vehicle states, operating conditions, or vehicle related activity. Though the controller 40 is shown disposed in a portion of the closure 22, the controller 40 may be located in various locations of the vehicle 12 and in communication with the light assembly 26 by various electronic connections. Further details regarding the controller 40 are discussed in reference to FIG. 8.

In some embodiments, the leads 42 may be wired behind a seal 46 proximate an edge portion 44 of the closure 22. In this configuration, the light assembly may be disposed proximate the edge portion 44 and outside of the seal 46 when the closure 22 is arranged in the ajar position. In response to the ajar condition, as detected by one or more vehicle systems including but not limited to the controller 40, the vehicle control module, and/or various peripheral in communication therewith, the controller 40 is operable to activate the light assembly 26 to illuminate the gap formed between the edge portion 44 and the adjacent panel 34. As such, the disclosure may further provide for a visual alert system operable to output a visual warning in response to the closure 22 of the vehicle 12 being ajar.

Figure 5:
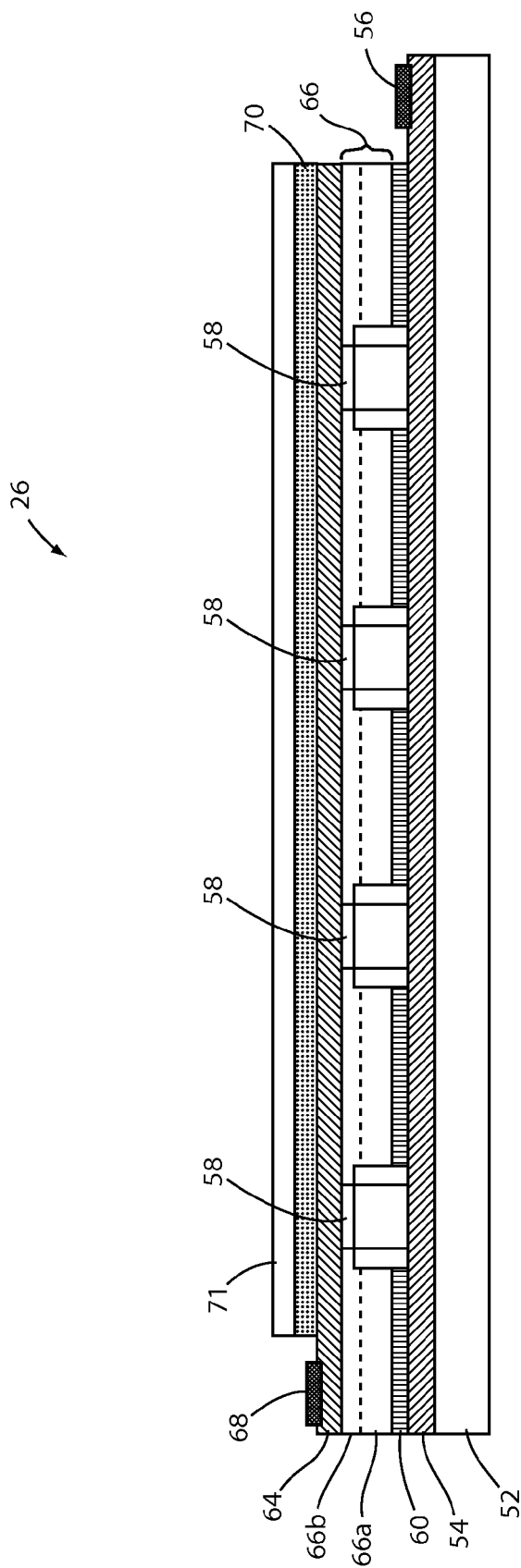
FIG. 5 is a detailed side view of a light producing assembly comprising a photoluminescent layer.

Referring to FIG. 5, the light producing assembly 26 may correspond to a thin-film or printed light emitting diode (LED) assembly. The light producing assembly 26 may comprise a substrate 52. The substrate 52 may be opaque, transparent, or semi-transparent and may be thin. The light producing assembly 26 may be utilized in a variety of applications, which may require a thin overall thickness. The substrate 52 may be of a polymer, for example polycarbonate, poly-methyl methacrylate (PMMA), polyethylene terephthalate (PET), etc. In some embodiments, the substrate 52 may be dispensed from a roll to provide for integration into assembly operations for the light producing assembly 26 and may be approximately 0.005 to 0.060 inches thick.

A first electrode 54 or conductive layer may be disposed on the substrate 52. The first electrode 54 and/or various electrodes or conductive layers discussed herein may comprise a conductive epoxy, such as a silver-containing or copper-containing epoxy. The first electrode 54 is conductively connected to a first bus bar 56. The first bus bar 56 and other bus bars or conduits discussed herein may be of metallic and/or conductive materials which may be screen printed on the electrodes or conductive layers. Bus bars may be utilized in the light producing assembly 26 to conductively connect a plurality of light-emitting diode (LED) sources 58 to a power source. In this way, the first bus bar 56, and other bus bars utilized in the light producing assembly, may be configured to uniformly deliver current along and/or across a surface of the light producing assembly 26.

The LED sources 58 may be printed, dispersed or otherwise applied to the first electrode 54 via a semiconductor ink 60. The LED sources 58 may be dispersed in a random or controlled fashion within the semiconductor ink 60. The LED sources 58 may correspond to micro-LEDs of gallium nitride elements, which may be approximately 5 microns to 400 microns across a width substantially aligned with the surface of the first electrode. The semiconductor ink 60 may include various binding and dielectric materials including but not limited to one or more of gallium, indium, silicon carbide, phosphorous and/or translucent polymeric binders. In this configuration, the semiconductor ink 60 may contain various concentrations of LED sources 58 such that a surface density of the LED sources 58 may be adjusted for various applications.

In some embodiments, the LED sources 58 and semiconductor ink 60 may be sourced from Nth Degree Technologies Worldwide Inc. The semiconductor ink 60 can be applied through various printing processes, including ink jet and silk screen processes to selected portion(s) of the substrate 52. More specifically, it is envisioned that the LED sources 58 are dispersed within the semiconductor ink 60, and shaped and sized such that a substantial quantity of them preferentially align with the first electrode 54 and a second electrode 64 during deposition of the semiconductor ink 60. The portion of the LED sources 58 that ultimately are electrically connected to the electrodes 54, 64 may be illuminated by a voltage source applied across the first electrode 54 and the second electrode 64. In some embodiments, a power source operating at 12 to 16 VDC from a vehicular power source may be employed as a power source to supply current to the LED sources 58. Additional information regarding the construction of a light producing assembly similar to the light producing assembly 26 is disclosed in U.S. Patent Publication No. 2014-0264396 A1 to Lowenthal et al., entitled "ULTRA-THIN PRINTED LED LAYER REMOVED FROM SUBSTRATE," filed Mar. 12, 2014, the entire disclosure of which is incorporated herein by reference.

At least one dielectric layer 66 may be printed over the LED sources 58 to encapsulate and/or secure the LED sources 58 in position. The at least one dielectric layer 66 may correspond to a first dielectric layer 66a and a second dielectric layer 66b, which may be of a transparent material. The second electrode 64 may correspond to a top transparent conductor layer printed over the dielectric layer 66 to electrically connect the electrodes 54, 64. The second electrode 64 is conductively connected to a second bus bar 68. The bus bars 56, 68 may be utilized in the light producing assembly 26 to conductively connect a plurality of light-emitting diode (LED) sources 58 to the power source.

In some embodiments, the first electrode 54 and the second electrode 64 may correspond to a cathode electrode and an anode electrode, respectively. Though described as a cathode and an anode of the light producing assembly 26, the first electrode 54 and the second electrode 64 may be arranged such that the second electrode 64 (anode) is disposed on the substrate and the first electrode 54 cathode is disposed on the at least one dielectric layer 66. The bus bars 56, 68 may be printed along opposite edges of the electrodes 54, 64 and electrically terminate at anode and cathode terminals. Points of connection between the bus bars 56, 68 and the power source may be at opposite corners of each bus bar 56, 68 for uniform current distribution along each bus.

Still referring to FIG. 5, a photoluminescent layer 70 may be applied to the second electrode 64. The photoluminescent layer may be applied as a coating, layer, film, and/or photoluminescent substrate. The photoluminescent layer 70 may be applied by screen printing, flexography, and/or otherwise affixed to the second electrode 64. In various implementations, the LED sources 58 may be configured to emit an excitation emission comprising a first wavelength corresponding to blue light. The LED sources 58 may be configured to emit the excitation emission into the photoluminescent layer 70 such that the photoluminescent material becomes excited. In response to the receipt of the excitation emission, the photoluminescent material converts the excitation emission from the first wavelength to an output emission comprising at least a second wavelength longer than the first wavelength. Additionally, one or more coatings 71 or sealing layers may be applied to an exterior surface of the light producing assembly 26 to protect the photoluminescent layer 70 and various other portions of the assembly 26 from damage and wear.

Figure 6:
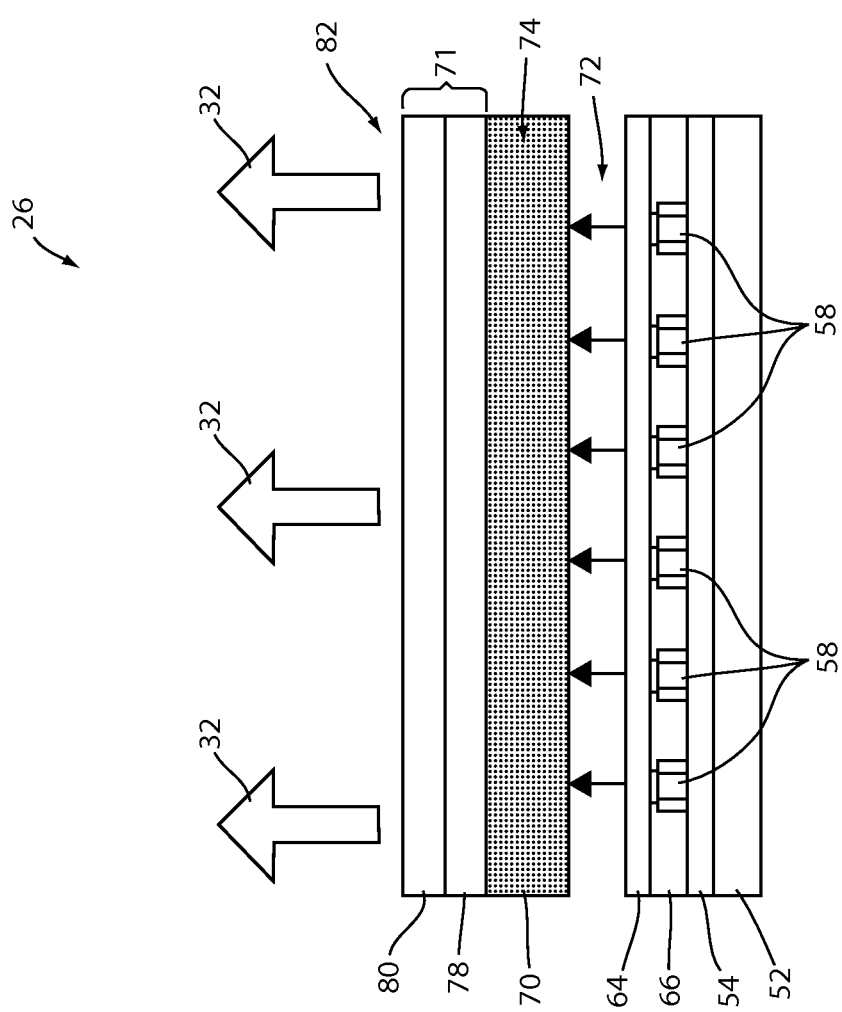
FIG. 6 is a side view of a light producing assembly demonstrating a photoluminescent layer configured to convert a wavelength of light.

Referring now to FIG. 6, a detailed view of photoluminescent layer 70 of the light producing assembly 26 is shown. The light producing assembly 26 is configured similar to the light producing assembly 26 demonstrated in FIG. 5, with like-numbered elements having the same or comparable function and structure. Though not shown in FIG. 6, the LED sources 58 are in electrical communication with the electrodes 54, 64 and a power source such that an excitation emission may be output from LED sources 58.

In an exemplary implementation, the excitation emission 72 may correspond to an excitation emission having a first wavelength corresponding to a blue, violet, and/or ultraviolet spectral color range. The blue spectral color range comprises a range of wavelengths generally expressed as blue light (~440-500 nm). In some implementations, the first wavelength $\lambda_1$ may comprise a wavelength in the ultraviolet and near ultraviolet color range (~100-450 nm). In an exemplary implementation, the first wavelength may be approximately equal to 470 nm. Though particular wavelengths and ranges of wavelengths are discussed in reference to the first wavelength, the first wavelength may generally be configured to excite any photoluminescent material.

In operation, the excitation emission 72 is transmitted into an at least partially light transmissive material of the photoluminescent layer 70. The excitation emission is emitted from the LED sources 58 and may be configured such that the first wavelength corresponds to at least one absorption wavelength of one or more photoluminescent materials disposed in the photoluminescent layer 70. For example, the photoluminescent layer 70 may comprise an energy conversion layer 74 configured to convert the excitation emission 72 at the first wavelength to an output emission 32 having a second wavelength, different from the first wavelength. The output emission 32 may comprise one or more wavelengths, one of which may be longer than the first wavelength. The conversion of the excitation emission 72 to the output emission 32 by the energy conversion layer 74 is referred to as a Stokes shift.

In some embodiments, the output emission 32 may correspond to a plurality of wavelengths. Each of the plurality of wavelengths may correspond to significantly different spectral color ranges. For example, the at least second wavelength of the output emission 32 may correspond to a plurality of wavelengths (e.g. second, third, etc.). In some implementations, the plurality of wavelengths may be combined in the output emission 32 to appear as substantially white light. The plurality of wavelengths may be generated by a red-emitting photoluminescent material having a wavelength of approximately 620-750 nm, a green emitting photoluminescent material having a wavelength of approximately 526-606 nm, and a blue or blue green emitting photoluminescent material having a wavelength longer than the first wavelength $\lambda_1$ and approximately 430-525 nm. The plurality of wavelengths may be utilized to generate a wide variety of colors of light from the each of the photoluminescent portions converted from the first wavelength. Though the particular colors of red, green, and blue are referred to herein, various photoluminescent materials may be utilized to generate a wide variety of colors and combinations to control the appearance of the output emission 32.

The photoluminescent materials, corresponding to the photoluminescent layer 70 or the energy conversion layer 74, may comprise organic or inorganic fluorescent dyes configured to convert the excitation emission 72 to the output emission 32. For example, the photoluminescent layer 70 may comprise a photoluminescent structure of rylenes, xanthenes, porphyrins, phthalocyanines, or other materials suited to a particular Stokes shift defined by an absorption range and an emission fluorescence. In some embodiments, the photoluminescent layer 70 may be of at least one inorganic luminescent material selected from the group of phosphors. The inorganic luminescent material may more particularly be from the group of Ce-doped garnets, such as YAG:Ce. As such, each of the photoluminescent portions may be selectively activated by a wide range of wavelengths received from the excitation emission 72 configured to excite one or more photoluminescent materials to emit an output emission having a desired color.

Still referring to FIG. 6, the light producing assembly 26 may further include the coating 71 as at least one stability layer 78 configured to protect the photoluminescent material contained within the energy conversion layer 74 from photolytic and/or thermal degradation. The stability layer 78 may be configured as a separate layer optically coupled and adhered to the energy conversion layer 74. The stability layer 78 may also be integrated with the energy conversion layer 74. The photoluminescent layer 70 may also optionally include a protection layer 80 optically coupled and adhered to the stability layer 78 or any layer or coating to protect the photoluminescent layer 70 from physical and chemical damage arising from environmental exposure.

The stability layer 78 and/or the protection layer 80 may be combined with the energy conversion layer 74 to form an integrated photoluminescent structure 82 through sequential coating or printing of each layer, or by sequential lamination or embossing. Additionally, several layers may be combined by sequential coating, lamination, or embossing to form a substructure. The substructure may then be laminated or embossed to form the integrated photoluminescent structure 82. Once formed, the photoluminescent structure 82 may be applied to a surface of at least one of the electrodes 54, 64 such that the excitation emission 72 received from the LED sources 58 and converted to the output emission 32. Additional information regarding the construction of photoluminescent structures to be utilized in at least one photoluminescent portion of a vehicle is disclosed in U.S. Pat. No. 8,232,533 to Kingsley et al., entitled "PHOTOLYTICALLY AND ENVIRONMENTALLY STABLE MULTILAYER STRUCTURE FOR HIGH EFFICIENCY ELECTROMAGNETIC ENERGY CONVERSION AND SUSTAINED SECONDARY EMISSION," filed Nov. 8, 2011, the entire disclosure of which is incorporated herein by reference.

In some embodiments, the coating 71 may further comprise a colored layer applied to the light assembly 26 and configured to control or adjust an appearance of the light assembly 26 in an unilluminated state. As shown in FIG. 6, the colored layer may correspond to reference numerals 78 and/or 80. The colored layer may comprise an at least partially light transmissible polymeric layer or coating that may be applied to an outer surface of the light assembly 26. The colored layer may be tinted any color to suit a desired appearance of the light assembly 26. In an exemplary embodiment, the photoluminescent material of the energy conversion layer may correspond to a red emitting rylene dye. Such a dye may cause the photoluminescent layer 70 to have a somewhat orange appearance. In such embodiments, the colored layer may be utilized to tint the light assembly 26 to a red color similar to that of the output emission 32 from the photoluminescent layer 70 when excited. In this way, the light assembly may have a consistent color appearance when the LED sources 58 are both active and inactive.

Figure 7:
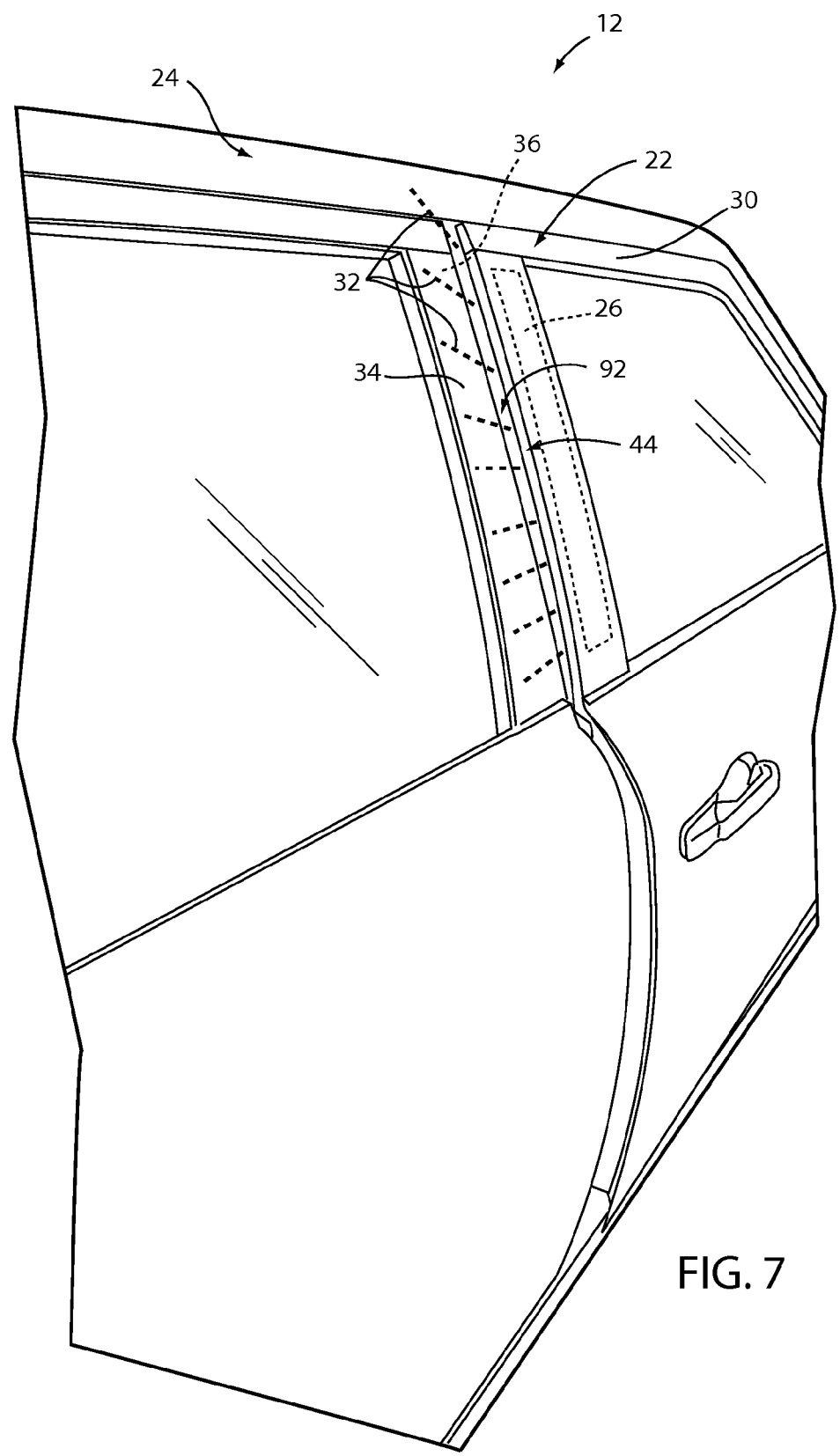
FIG. 7 is a detailed perspective view of a closure demonstrating a door ajar condition.

Referring now to FIG. 7, the light assembly 26 is shown in an ajar position. In the ajar position, the closure 22 may be partially closed such that gap 92 is formed between the door frame 30 and an adjacent panel 34 of the vehicle 12. In the ajar position, the light assembly 26 may be housed between the door jamb 36 and the door frame 30. The thin structure of the light assembly may provide for the light assembly 26 to be utilized in the small space located between the door jamb 36 and the door frame 30, as well as various other locations throughout the vehicle 12. In this way, the disclosure provides for an advantageous lighting apparatus that may be utilized in various locations to enhance safe operation as well as the decorative appearance of the vehicle 12.

In some embodiments, a reflective material, for example a paint or coating configured to reflect light, may be disposed on the door jamb 36. The reflective material may be configured to reflect the output emission 32 from the light producing assembly 26 disposed on the interior surface 28 of the door frame 30. The output emission 32 may be reflected from the door jamb 36 via the reflective material. The reflective material may correspond to a light color of paint, a reflective material applied to the door jamb 36, or any form of material or coating configured to improve a reflection of the output emission 36 from the door jamb 36.

In some embodiments, a first portion of the output emission 32 may be reflected outward between an edge portion 44 of the closure 22. Additionally, a second portion of the output emission 32 may be reflected inward such that the output emission 32 is also configured to illuminate a portion of the passenger cabin of the vehicle 12. For example, in response to the closure 22 be arranged in an ajar position, the second portion of the output emission 32 may illuminate at least a portion of the passenger cabin proximate a gap formed by the body 24 and the closure 22. In this configuration, the illumination apparatus is configured generate a visual warning to alert an occupant of the vehicle 12 of a door ajar condition by illuminating at least a portion of the passenger compartment with the output emission 32.

Figure 8:
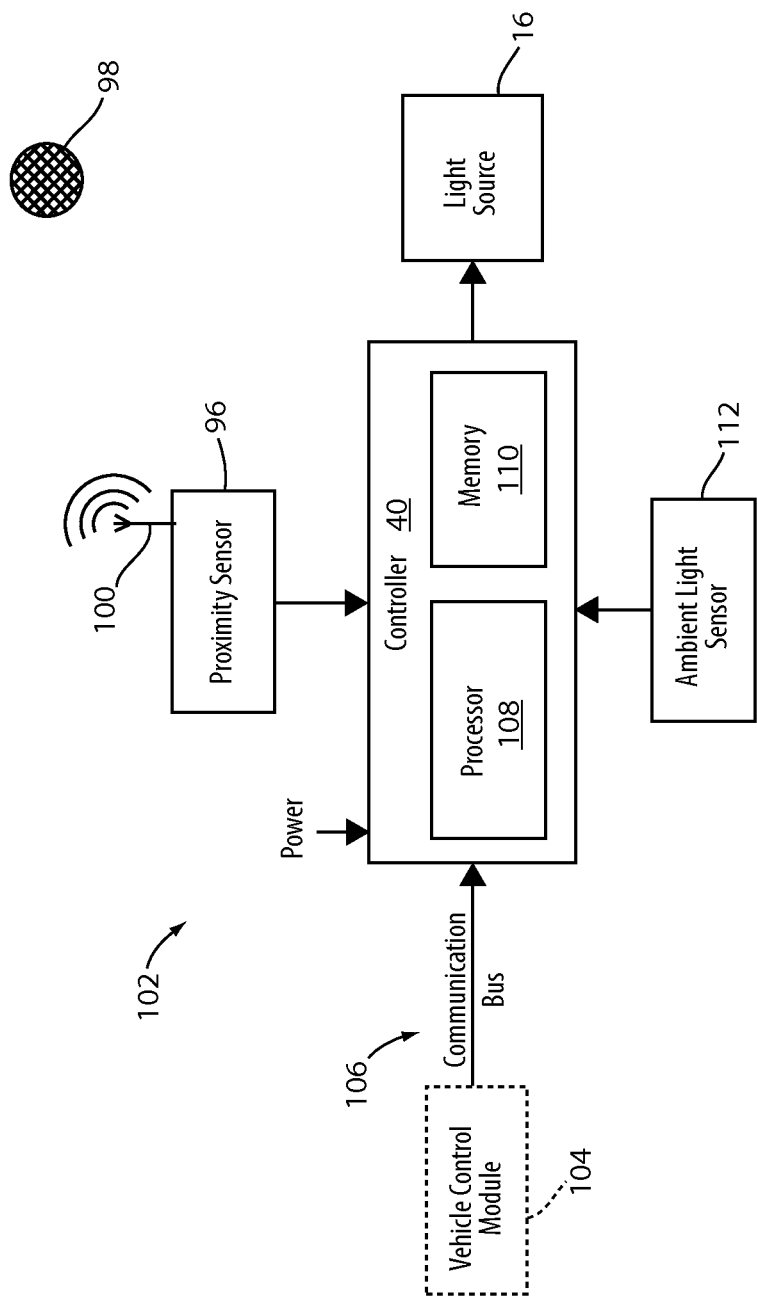
FIG. 8 is a block diagram of a lighting apparatus configured to control the illumination of a light producing assembly.

Referring now to FIGS. 7 and 8 in an exemplary embodiment, the controller 40 may be in communication with a proximity sensor 96 operable to detect an approximate range and/or presence of a key fob 98, smart key, or similar device. In order to detect the presence of the key fob 98, the proximity sensor 96 may utilize one or more antennas 100 to identify a presence or proximity of the key fob 98. In such embodiments, the controller 40 may control the light assembly 26 in response to the detection or proximity of the key fob 98. The following example may illustrate an implementation of the proximity sensor 96 as a control input for the controller 40.

Upon opening the closure 22 (e.g. the passenger door), the controller 40 may be configured to receive a signal from a door sensor or a switch corresponding to a detection that the closure 22 is in the open position and activate the light assembly 26. As such, the light assembly may emit red light to warn nearby vehicles that the closure 22 is open and thus ajar. After a first duration of time, (e.g. 1 minute), the controller 40 may be configured to cause the light assembly to flash on and off at a decreased duty cycle (e.g. 50%) and a first increased intensity approximately twice the intensity of the output emission 32. Additionally, the controller 40 may detect that the key fob 98 has exceeded a first distance threshold (e.g. 3 m) and begin to flash on and off at a decreased duty cycle (e.g. 20%) and a second increased intensity of approximately five times the intensity of the output emission 32. In this configuration, the controller 40 may identify that an operator of the vehicle 12 is leaving the area proximate the vehicle 12 while the closure 22 is ajar and attempt to alert the driver by illuminating the light assembly 26 with an increased intensity. As discussed herein, the intensity of the output emission 32 may be increased in response to at least one of a period of time that the closure 22 has been opened or a distance of a key fob 98 relative to the vehicle 12.

Referring to FIG. 8, a block diagram of a lighting apparatus 102 or system comprising the light assembly 26 is shown. The controller 40 is in communication with the light assembly via the electrode terminals. The controller 40 may be in communication with the vehicle control module 104 via a communication bus 106 of the vehicle. The communication bus 106 may be configured to deliver signals to the controller 40 identifying various vehicle states. For example, the communication bus 106 may be configured to communicate to the controller 40 a drive selection of the vehicle, an ignition state, a door open or ajar status, a remote activation of the light assembly 26, or any other information or control signals that may be utilized to activate or adjust the output emission 32. Though the controller 40 is discussed herein, in some embodiments, the light assembly 26 may be activated in response to an electrical or electro-mechanical switch in response to a position of the closure 22.

The controller 40 may comprise a processor 108 comprising one or more circuits configured to receive the signals from the communication bus 106 and output signals to control the light assembly 26 to emit the output emission 32. The processor 108 may be in communication with a memory 110 configured to store instructions to control the activation of the light assembly 26. The controller 40 may further be in communication with an ambient light sensor 112. The ambient light sensor 112 may be operable to communicate a light condition, for example a level brightness or intensity of the ambient light proximate the vehicle 12. In response to the level of the ambient light, the controller 40 may be configured to adjust a light intensity output from the light assembly 26. The intensity of the light output from the light assembly 26 may be adjusted by controlling a duty cycle, current, or voltage supplied to the light assembly 26.

For the purposes of describing and defining the present teachings, it is noted that the terms "substantially" and "approximately" are utilized herein to represent the inherent degree of uncertainty that may be attributed to any quantitative comparison, value, measurement, or other representation. The term "substantially" and "approximately" are also utilized herein to represent the degree by which a quantitative representation may vary from a stated reference without resulting in a change in the basic function of the subject matter at issue.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. An illumination apparatus for a vehicle comprising:
a closure frame configured to engage an opening formed by a body of the vehicle;
a light source disposed proximate an edge of the closure frame outside a closure seal such that an emission of light from the light source is projected through a gap between the closure frame and the body in response to the closure frame being arranged in a partially closed arrangement forming the gap, wherein the partially closed arrangement corresponds to the closure frame at least partially engaging the body of the vehicle; and
a controller in communication with the light source. where the controller is configured to adjust at least one of an intensity and a frequency of the light emitted from the light source in response to a distance of a key fob exceeding a threshold.

2. The apparatus according to claim 1, further comprising a controller configured to control the light source, wherein the controller selectively activates the light source to illuminate the gap in response to a door ajar condition.

3. The apparatus according to claim 2, wherein the controller is configured to adjust an intensity of the emission in response to a key fob of the vehicle exceeding a distance threshold during the door ajar condition.

4. The apparatus according to claim 2, wherein the controller is further operable to activate the light source in response to at least one of a user input, a turn indication signal, and a hazard light activation signal.

5. The apparatus according to claim 1, wherein the closure frame corresponds to at least one of a passenger door, an engine compartment hood, a hatch, and a decklid of the vehicle.

6. The apparatus according to claim 1, wherein the gap formed between the closure frame and body corresponds to a door jamb.

7. The apparatus according to claim 6, wherein the light source is disposed on the closure frame outside the closure seal disposed on an interior surface of the closure frame.

8. An illumination apparatus for a vehicle comprising:
a door configured to engage an opening formed by a body of the vehicle;
a light source disposed proximate an edge of the door such that an emission of light from the light source is projected through a gap between the door and at least one panel of the vehicle; and a controller configured to:
activate the light source in response to the door being arranged in an ajar position; and
adjust at least one of an intensity and a frequency of a light emitted from the light source in response to a distance of a key fob exceeding at least one threshold.

9. The apparatus according to claim 8, further comprising a controller configured to control the light source, wherein the controller selectively activates the light source to illuminate the gap in response to a door ajar condition.

10. The apparatus according to claim 8, wherein the controller is configured to increase the intensity of the light in response to a distance of the key fob exceeding a first threshold.

11. The apparatus according to claim 10, wherein the controller is configured to adjust an intermittent frequency of the light emitted from the light source in response to a distance of the key fob exceeding a second threshold.

12. The apparatus according to claim 8, wherein the ajar position corresponds to the door being arranged such that a narrow gap is formed between the door and the at least one panel of the vehicle.

13. An illumination apparatus for a vehicle comprising:
a door configured to engage an opening formed by a body of the vehicle;
a light source disposed proximate a jamb of the door outside a door seal such that an emission of light from the light source is projected through a gap between the door and at least one panel of the vehicle in response to the door being arranged in a partially closed arrangement forming the gap; and
a controller in communication with the light source, where the controller is configured to adjust at least one of an intensity and a frequency of a light emitted from the light source in response to a distance of a key fob exceeding a threshold.

14. The apparatus according to claim 13, further comprising a controller configured to activate the light source in response to the door being arranged in an ajar position.

15. The apparatus according to claim 13, wherein the light source is disposed on an interior surface of the door outside the door seal disposed on the interior surface of the door frame.

16. The apparatus according to claim 13, wherein the light source corresponds to a substantially flat LED assembly disposed on the interior surface of the door frame.

17. The apparatus according to claim 13, wherein the light source comprises a photoluminescent layer configured to convert a first emission from at least one emitter of the light source to a second emission.

18. The apparatus according to claim 17, wherein the first emission corresponds to first color and the second emission corresponds to a second color different than the first color.

19. The apparatus according to claim 13, wherein the photoluminescent layer comprises an organic photoluminescent dye.

* * * * *